United States Patent [19]

Ito et al.

[11] 4,429,281
[45] Jan. 31, 1984

[54] INTEGRATOR FOR A SWITCHED CAPACITOR-FILTER

[75] Inventors: Akihiko Ito, Kawasaki; Kazuhiro Kobayashi, Tokyo; Hisami Tanaka, Yokohama; Norio Ueno, Kawasaki, all of Japan

[73] Assignee: Fujitsu Limited, Kawasaki, Japan

[21] Appl. No.: 213,399

[22] Filed: Dec. 5, 1980

[30] Foreign Application Priority Data

Dec. 5, 1979 [JP] Japan .............................. 54-168361[U]

[51] Int. Cl.³ .............................................. H03F 1/00
[52] U.S. Cl. .......................................... 330/9; 330/51; 330/107; 328/128
[58] Field of Search ..................... 330/9, 51, 107, 109; 328/127, 128, 167; 333/173

[56] References Cited

U.S. PATENT DOCUMENTS 3,836,893 9/1974 Lamden ...................... 340/173 CA

OTHER PUBLICATIONS

Hosticka et al., "MOS Sampled Data Recursive Filters Using Switched Capacitor Integrators", *IEEE Journal of Solid-State Circuits*, vol. SC-12, No. 6, Dec. 1977, pp. 600–608.

Primary Examiner—James B. Mullins
Attorney, Agent, or Firm—Staas & Halsey

[57] ABSTRACT

An integrator for use in a switched capacitor-filter, in which switching elements are connected to an input and to an output of an operational amplifier included in the integrator for clamping the input and output to a ground potential during suspension of the integral operation, in order to prevent potentials at the input and output of the operational amplifier from varying and hence ensure rapid stabilization of the integral operation of the integrator.

6 Claims, 6 Drawing Figures

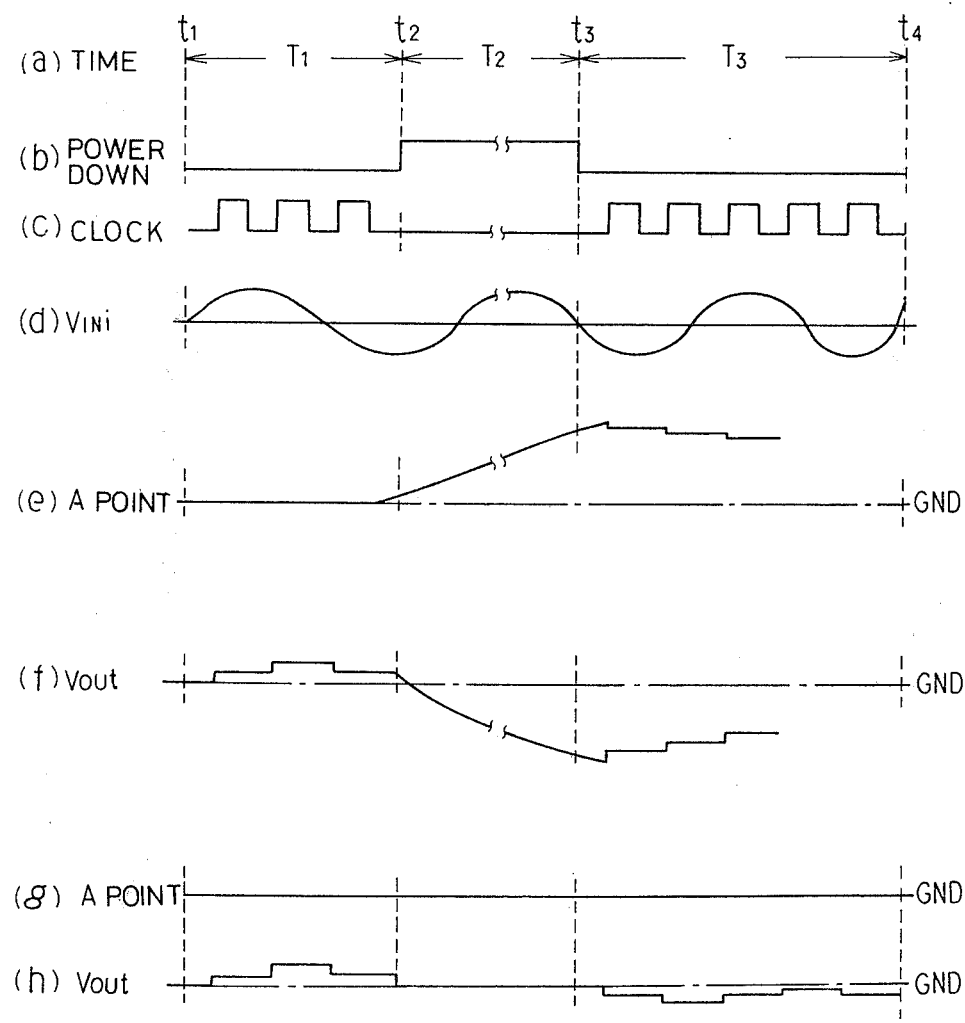

INTEGRATOR FOR A SWITCHED CAPACITOR-FILTER

BACKGROUND OF THE INVENTION

1. Field of the Invention

The present invention relates to an integrator, and more particularly to an integrator for use in a switched capacitor-filter or the like.

2. Description of the Prior Art

It is well-known in the art that in a switched capacitor-filter, such as integrator as shown in FIG. 1 is used as a fundamental unit of the filter (see, for example, IEEE Journal of Solid-State Circuits, Vol. SC-12, No. 6, December 1977, pp. 600–608.). In FIG. 1, the integrator comprises a switched capacitor, including a capacitor CA and a switching element S for periodically switching the capacitor CA to input and output sides a and b. The integrator also includes an operational amplifier OP having a first input connected to the output side b of the switching element S and having the second input connected to a reference potential source, in the illustrated example, a ground, and an integrating capacitor CB connected between the first input and the output of the operational amplifier OP. The operation of this integrator is as follows: In an ideal situation the operational amplifier OP has infinite DC gain and input impedance and zero output impedance, and if the operational amplifier OP is assumed to be ideal, then the potential at a point A is zero. When connecting the switching element S to the input side a when $t=0$, letting an input voltage $V_{IN}$ at that time be represented by $V_{IN0}$, charges $Q_A = V_{IN0} \cdot CA$ are stored in the integrating capacitor CB. Next, when the switching element S is switched to the output side b from the input side a at $t=t_1$, the charges $Q_A = V_{IN0} \cdot Ca$ are connected to the point A and thence are applied to the capacitor CA. Accordingly, the output voltage Vout from the operational amplifier OP long after the moment $t=t_1$ becomes as follows:

$$Vout = Vout_0 - \frac{CA}{CB} V_{IN0} \qquad (1)$$

where $Vout_0$ is an output voltage of the operational amplifier OP at the moment of switching the switching element S to the output side b. The reason is that since the output of the operational amplifier OP is fed back to its input side, the potential at the point A is zero as described above and if the potential at the point A is zero, then charges $Q_A$ of the capacitor CA are all transferred to the integrating capacitor CB, making its potential equal to the output voltage Vout. Repeating the above operation of connecting the switching element S to the input side a and then to the output side b, th output voltage Vout becomes as follows:

$$Vout = Vout_0 - n\frac{CA}{CB} V_{IN0} \qquad (2)$$

where n is the number of times the switching element S is switched from a to b. In the above expression, $V_{IN0}$ is constant and if equation (2) is a function of time, then the second term of the expression becomes an integral expression. While this integrator continuously operates, switching the switching element S between the input and output sides a and b, there is no problem, but when the integrator is out of operation, the following problem arises: That is, while the integrator is out of operation, what is called a power-down procedure is taken with a view toward avoiding power consumption. The power-down procedure is carried out by turning OFF entirely or partly the power source of the operational amplifier OP in order to stop its function. As a consequence, the function of holding the point A at the potential of the other input terminal, in this example, at a zero level is lost and the point A assumes a variable potential depending on a leakage current, induction current or the like. When the potential at the point A becomes variable, for example, a positive or negative high potential while the integrator is held out of operation for a long time, it is necessary at the start of an integral operation, the above-mentioned high potential be lowered to the zero level via the negative feedback circuit including the integrating capacitor. Because the potential must be lowered much time is required until the potential at the point A becomes stable.

SUMMARY OF THE INVENTION

It is an object of the present invention to provide an integrator which is free from the above-mentioned defect of the prior art and in which a switching element is connected to the input or to the input and the output of the operational amplifier in order to connect the input and the output to a reference potential source, for instance, the ground. During suspension of the integral operation of the operational amplifier, its input and the output side are clamped at the reference potential, thereby preventing the potential from becoming variable, and hence avoiding elongation of the time necessary for stabilizing the potential at the start of an integral operation.

BRIEF DESCRIPTION OF THE DRAWINGS

FIG. 5 is a timing chart explanatory of the power-down control signal applying operation.

DESCRIPTION OF THE PREFERRED EMBODIMENTS

With reference to the drawings, the present invention will hereinafter be described in detail.

Figure 1:
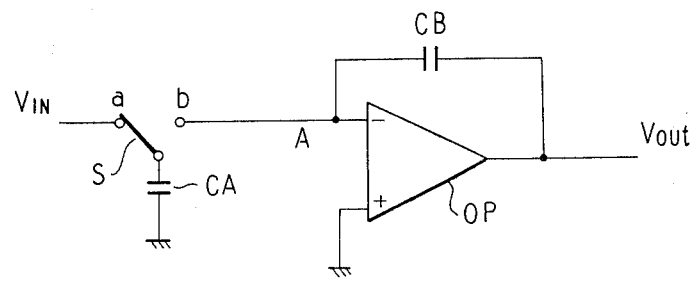
FIG. 1 is a circuit diagram showing a conventional integrator.
Figure 2:
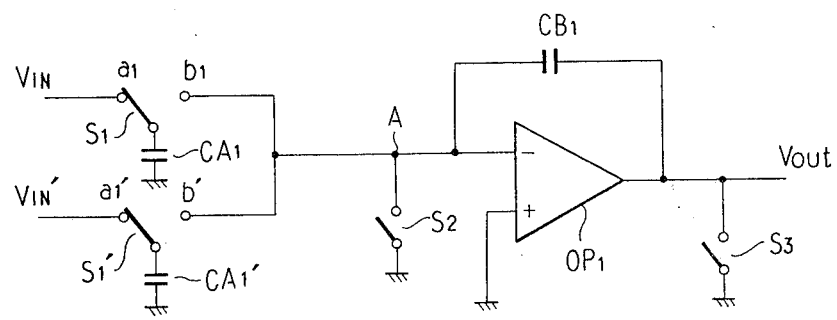
FIG. 2 is a circuit diagram illustrating a first embodiment of the present invention.

FIG. 2 illustrates a first embodiment of the integrator of the present invention. In FIG. 2, a capacitor $CA_1$ and a switching element $S_1$ comprise a resistance-capacitance element which comprises the aforementioned switched capacitor, and a capacitor $CA_1'$ and a switching element $S_1'$ similarly comprise a resistance-capacitance element which comprises a second switched capacitor. The first and second switched capacitors receive input voltages $V_{IN}$ and $V_{IN}'$ respectively, and both apply their outputs to a first input of an operational amplifier OP1. Reference character CB1 indicates an integrating capacitor connected between the first input and an output of the operational amplifier OP1, S2 designates a switching element connected between the first input of the operational amplifier OP1 and the ground, and S3 identifies a switching element connected between the output of the operational amplifier OP1 and the ground. A second input of the operational amplifier OP1 is grounded. In this embodiment the first input of the operational amplifier is a negative input end and the second input is a positive input however, the inputs may be reversed in polarity, in which case it is obvious that a negative sign in the second term of each of the above-mentioned expressions (1) and (2) changes to a positive sign.

When the operational amplifier OP1 is in operation, the switching elements S2 and S3 are both held in the OFF state. When the operational amplifier OP1 is out of operation, they are held in the ON state in order to maintain the input of the operational amplifier OP1 at the zero level. The switching elements S2 and S3 are comprised of field effect transistors, which are manufactured as one integrated circuit on a common semiconductor substrate together with semiconductor elements comprising the integrator. The assembly is used, for instance, as a general-purpose basic filter block.

Next, a description will be given of the operation of the first embodiment of the present invention shown in FIG. 2. When only one of the switching elements $S_1$ and $S_1'$ of the switched capacitors perform the switching operation, the result is the same as described previously and the integrated output Vout becomes such as shown by the expression (2). When the switching elements $S_1$ and $S_1'$ both perform the switching operation at the same time, the output voltage Vout becomes as follows:

$$Vout = Vout_0 - n \frac{CA_1}{CB_1} V_{IN0} - m \frac{CA'_1}{CB_1} V_{IN0} \quad (3)$$

where m is the number of switching operations of the switching element $S_1'$. When the integral operation is suspended, the switching elements $S_1$ and $S_1'$ of the switched capacitor are stopped from switching and the switching elements S2 and S3 are turned ON. As a result, the reference point A is clamped to the ground potential and even if external charges flow into the reference point A, its potential is not varied and is maintained at the zero level. In order to reactivate the integrator, the switching elements S2 and S3 which have been closed are opened and the switching elements $S_1$ and $S_1'$ of the switched capacitor are started switching again. Thus, the charging and discharging of the integrating capacitors $CA_1$ and $CA_1'$ is resumed and restarting of the integral operation of the integrator is accomplished. In addition, at the start of the integration operation, the potential at the point A is at zero volts which is the potential during the integral operation and the output voltage at the start of the integration operation also has a value close to the voltage attained during the integration operation (usually about 3 V at highest), so that the integral operation immediately becomes stable. Thus a long transient time is not required before the integration operation becomes stable.

Figure 3:
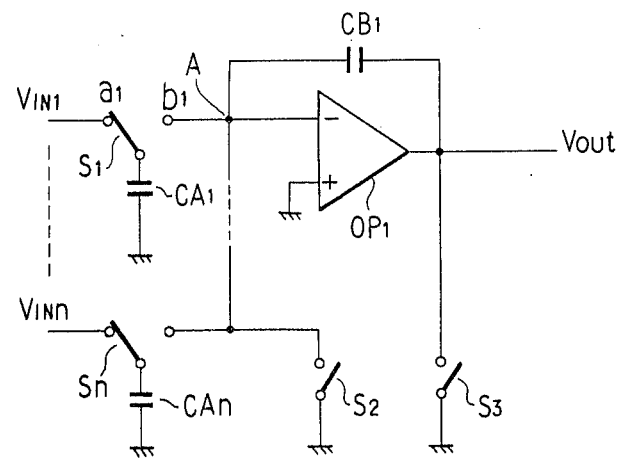
FIG. 3 is a circuit diagram illustrating a second embodiment of the present invention.

FIG. 3 illustrates a second embodiment of the present invention. In FIG. 3, parts corresponding to those in the foregoing embodiment are identified by the same reference characters. Reference characters $CA_1, \ldots, CA_n$ and $S_1, \ldots, S_n$ indicate n capacitors and n switching elements which comprise n switched capacitors; OP1 designates an operational amplifier; $CB_1$ identifies an integrating capacitor; S2 denotes a switching element connected between a first input of the operational amplifier OP1 and the ground; and S3 represents a switching element connected between the ouput of the operational amplifier OP1 and the ground. The integrator of this embodiment is substantially the same as the integrator of the foregoing embodiment except that the n switched capacitors are employed and when the n switched operators are all operated at the same time, the output voltage Vout is given by the following expression (4) which is expression (3) extended:

$$Vout = Vout_0 - \sum_{i=1}^{n} m_i \frac{CA_i}{CB_1} V_{INi} \quad (4)$$

where $m_i$ is a positive integer.

The present invention is of particular utility when employed for quickly returning a circuit to its normal mode of operation from a power-down mode in which the circuit has been held for the purpose of cutting power consumption when no circuit operation is required. The invention is effective to speed up the restoration of circuit operation.

Figure 4:
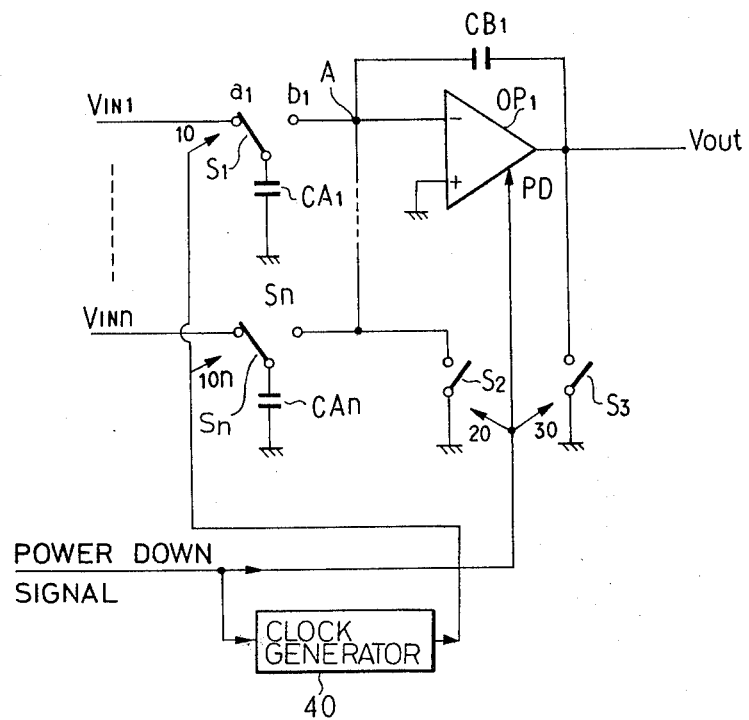
FIG. 4 is explanatory of an operation of applying a power-down control signal in the embodiment shown in FIG. 3.

FIG. 4 shows how the application of a power-down control signal to the embodiment shown in FIG. 3 occurs and FIG. 5 is a timing chart depicting the operation of the embodiment shown in FIG. 4. In FIG. 4 parts corresponding to those in FIG. 3 are identified by the same reference characters. Reference numeral 40 indicates a clock generator; arrows 10 and 10n designate clock signals which are applied to the switching elements $S_1$ and $S_n$, respectively; arrows 20 and 30 identify power-down control signals which are applied to the switching elements S2 and S3, respectively; and PD denotes a terminal for applying a power-down signal to the operational amplifier.

FIG. 5(a) shows timing intervals FIG. 5(b) shows the mode in which the power-down signal is applied to the operational amplifier OP1 at a moment $t_2$ and show that the operational amplifier is reactivated at a moment $t_3$. FIG. 5(c) shows timing of one of the switching elements ($S_1$ to $S_n$) and FIG. 5(d) shows an input waveform $V_{INi}$. FIGS. 5(e) and 5(f) respectively show the voltage at the point A and the output voltage Vout when the present invention is not used, that is, when the switching elements S2 and S3 are not used. FIGS. 5(g) and 5(h) respectively show the voltage at the point A and the output voltage Vout for the embodiment of FIG. 4. In FIG. 5 reference character GND indicates the ground potential and $T_1$, $T_2$ and $T_3$ respectively indicate operation times.

A description will be given, with reference to FIG. 5, of the operation of the embodiment shown in FIG. 4.

In the operation time $T_1$ between times $t_1$ and $t_2$ the integrator performs its normal operation and clock pulses are generated in order to carry out the integral operation. At the moment $t_2$ the power-down signal is applied to the terminal PD of the operational amplifier OP1. When the power-down signal assumes the "H" (high) level, the output terminal of the operational amplifier OP1 becomes a high-impedance, the switching elements S2 and S3 are turned ON and the operation of the clock generator 40 is stopped to discontinue the application of the clock pulses to the switching elements $S_1$ to $S_n$ to stop the integral operation, thus reducing the overall power consumption.

When the switching elements $S_2$ and $S_3$ are not used, the voltage at the point A may be become as shown in FIG. 5(e) due to backward saturated currents flowing between the sources and drains of transistors (usually field effect transistors) comprising the switching elements $S_1$ to $S_n$, so that the output voltage Vout becomes as shown in FIG. 5(f). In such a case, even if the power-down mode is switched to the normal mode of operation at the moment $t_3$, normal integral operation cannot be achieved until the potential at the point A becomes the ground level, and thus, time is wasted before restarting the normal integral operation.

However, when the switching elements $S_2$ and $S_3$ are employed, the potentials at the point A and the output terminal Vout are fixed at the ground level, as shown in FIGS. 5(g) and 5(h), at the moment when the power-down signal is applied, and when the power-down mode is switched to the normal mode of operation at the moment $t_3$, the integral operation is resumed without undue delay.

Figure 6:
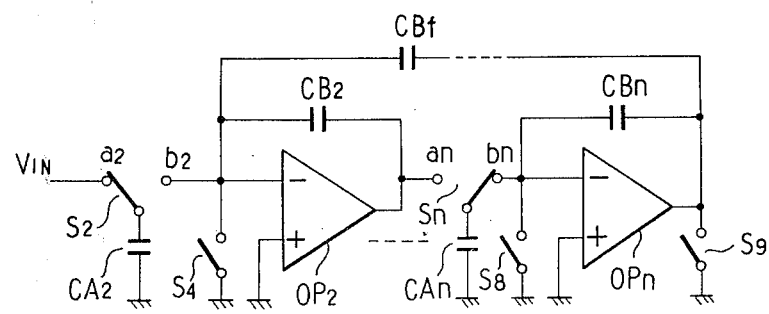
FIG. 6 is a circuit diagram illustrating a third embodiment of the present invention.

FIG. 6 illustrates a third embodiment of the present invention in which a switched capacitor-filter is comprised of a series connection of a plurality of integrators each of which is a fundamental unit of the filter. In FIG. 6, reference characters $CA_2$ and $S_2$, $CA_n$ and $S_n$ indicate capacitors and switching elements comprising switched capacitors; $OP_2$ to $OP_n$ designate operational amplifiers; $CB_2$ to $CB_n$ and $CF_f$ identify integrating capacitors; and $S_4$, $S_8$ and $S_9$ denote switching elements. The number of unit integrators to be cascade-connected and the integrating time constant of each integrator depend on the transfer function of the filter that is desired to be obtained. Also in such a filter, during suspension of its operation the switching elements $S_4$ to $S_9$ at the input and output of the operational amplifiers $OP_2$ to $OP_n$ are closed as in the foregoing embodiments, thereby clamping the potentials at the input and output at the ground potential. This prevents stray potential from developing and ensures that at the start of their operation the operational amplifiers $OP_2$ to $OP_n$ quickly enter into a stable state. In FIG. 6 a switching element for grounding the output of the operational amplifier $OP_2$ is not shown and it is desirable to ground this output end by the power-down signal.

In the embodiment shown in FIG. 6, the terminals of the capacitors $CA_2, \ldots, CA_n$ on the opposite side from the switching elements $S_2, \ldots, S_n$ and the plus input sides of the operational amplifiers are shown to be grounded but they may also be held at any other desired potential or potentials which may differ with each integrator. In such a case, it is obvious that the switching elements $S_4, S_8, \ldots$ are each connected between the potential source and the first input of the corresponding operational amplifier. The switching elements $S_4, S_8, \ldots$ may be PMOS, NMOS, CMOS bipolar switches or the like.

As has been described in the foregoing, the integrator of the present invention employs switching elements for clamping the input or the input and output of each operational amplifier to a reference voltage level while the operational amplifier is out of operation, so that when restarting the integral operation after its suspension, the integral operation can be rapidly be made stable. Further, since the switching elements can be manufactured simultaneously with the formation of the switch of the switched capacitor and can be miniaturized, the integrator of the present invention has the advantage that it can be produced without any particular modifications of conventional manufacturing steps and integrated circuit IC design.

It will be apparent that many modifications and variations may be effected without departing from the scope of the novel concepts of this invention.

What is claimed is:

1. A switched capacitor-filter, comprising:
    m integrators, where m is an integer greater than or equal to 2, where an input of the first integrator is an input of said switched capacitor-filter, an output of the mth integrator is an output of said switched capacitor-filter and the output of the m-1th integrator is operatively connected to the input of the mth integrator, each of said m integrators including:
    a switched capacitance, including:
        a switching element, having a first switchable terminal operatively connectable as the input of the mth integrator, having a second switchable terminal and having a non-switchable terminal, which is periodically switched between the switchable terminals; and
        a capacitor, operatively connected to the non-switchable terminal of said switching element, which is charged by the input voltage and discharged through the second switchable terminal of said switching element;
    an operational amplifier having a first input operatively connected to the second switchable terminal of said switching element of said switched capacitance for receiving the charge discharged from said switched capacitance, having a second input operatively connected to a reference potential and having an output which is the output of the mth integrator;
    an integrating capacitor operatively connected between the output and the first input of said operational amplifier; and
    a reference switching element, operatively connected between the first input of said operational amplifier and the reference potential, so that the potential at the first input of said operational amplifier is made equal to the reference potential when said reference switching element is closed;
    a feedback integrating capacitor operatively connected between the input of the operational amplifier of the first integrator and the output of the mth integrator; and
    an output switching element operatively connected between the output of the mth integrator and the reference potential.

2. A switched capacitor-filter as recited in claim 1, wherein said operational amplifier has a third input operatively connectable to receive a power down signal.

3. An integrator, operatively connectable to receive a power-down signal and an input voltage, comprising:
    means, operatively connectable to receive the power-down signal, for generating a clock signal in dependence upon the power-down signal;
    a switched capacitance, operatively connected to said means for generating a clock signal and operatively connectable to receive the input voltage, for receiving the clock signal and for storing and outputting the input voltage in dependence upon the clock signal;
    amplifier means, having a first input operatively connected to said switched capacitance and having a second input operatively connectable to receive the power-down signal, for receiving the input voltage and for generating, as an output of said integrator, an output voltage in dependence upon the power-down signal; and a first switching element operatively connectable to receive the power-down signal and operatively connected between the first input of said amplifier means and a reference voltage.

4. An integrator as recited in claim 3, further comprising a second switching element operatively connectable to receive the power-down signal and operatively connected between the output of said amplifier means and the reference voltage.

5. An integrator as recited in claim 3, wherein said switched capacitance comprises:

a capacitor having a first terminal operatively connected to the reference voltage and having a second terminal; and a capacitor switching element, having a nonswitchable terminal operatively connected to the second terminal of said capacitor, having a first switchable terminal operatively connectable to receive the input voltage, having a second switchable terminal operatively connected to the first input of said amplifier means, and having an input operatively connected to said means for generating the clock signal, for switching between the first and second switchable terminals in dependence upon the clock signal.

6. An integrator as recited in claim 3 or 4, wherein said amplifier means comprises:

an amplifier having a first input, which is the first input of said amplifier means, operatively connected to said switched capacitance, having a second input operatively connectable to receive the power-down signal, having a third input operatively connected to the reference voltage and having an output which is the output of said integrator; and an integrating capacitor operatively connected between the first input and the output of said amplifier.

* * * * *

UNITED STATES PATENT AND TRADEMARK OFFICE
CERTIFICATE OF CORRECTION

PATENT NO. : 4,429,281

DATED : JANUARY 31, 1984

INVENTOR(S) : AKIHIKO ITO ET AL.

It is certified that error appears in the above-identified patent and that said Letters Patent is hereby corrected as shown below:

```
FRONT PAGE [56] OTHER PUBLICATIONS
            line 3, "vol." should be --Vol.--.

Col. 1, line 31, "a" should be --$\underline{a}$--;
        line 35, "b" should be --$\underline{b}$--; and
                 "a" should be --$\underline{a}$--;
        line 47, "b" should be --$\underline{b}$--;
        line 51, after "then" insert --the--;
        line 55, "a" should be --$\underline{a}$--;
                 "b" should be --$\underline{b}$--; and
                 "th" should be --the--;
        line 61, "a to b" should be --$\underline{a}$ to $\underline{b}$--;
        line 67, "a and b" should be --$\underline{a}$ and $\underline{b}$,--.
```

UNITED STATES PATENT AND TRADEMARK OFFICE
CERTIFICATE OF CORRECTION

PATENT NO. : 4,429,281
DATED : JANUARY 31, 1984
INVENTOR(S) : AKIHIKO ITO ET AL.

It is certified that error appears in the above-identified patent and that said Letters Patent is hereby corrected as shown below:

Col. 2, line 14, after "," (second occurrence) insert --that--;
line 31, "side" should be --sides--;
line 64, "$V_{IN}$," should be --$V_{IN}'$--.

Col. 3, line 35, "$CA'_1$" should be --$CA_1'$--;
line 65, "$CA_1, \ldots CA_n$" should be --$CA_1, \ldots, CA_n$--;

line 66, "$S_1, \ldots S_n$" should be --$S_1, \ldots, S_n$--.

Col. 4, line 38, after "intervals" insert --and--;
line 40, "show" should be --shows--;
line 42, after "shows" insert --the--.

Col. 5, line 2, delete "be";
line 28, "$CF_f$" should be --$CB_f$--;
line 63, delete "be" (second occurrence).

Signed and Sealed this

Eleventh Day of December 1984

[SEAL]

Attest:

Attesting Officer

GERALD J. MOSSINGHOFF

*Commissioner of Patents and Trademarks*